(12) United States Patent
Chou Lu et al.

(10) Patent No.: US 11,582,541 B1
(45) Date of Patent: Feb. 14, 2023

(54) ELEVATING SPEAKER DEVICE FOR USE IN BATHTUB

(71) Applicants: Huei-Ching Chou Lu, New Taipei (TW); Tzeng-Tian Huang, New Taipei (TW); Ta-Tsung Dan, New Taipei (TW)

(72) Inventors: Huei-Ching Chou Lu, New Taipei (TW); Tzeng-Tian Huang, New Taipei (TW); Ta-Tsung Dan, New Taipei (TW)

(73) Assignee: TROLLING ENTERPRISES CO. LTD., New Taipei (TW)

( * ) Notice: Subject to any disclaimer, the term of this patent is extended or adjusted under 35 U.S.C. 154(b) by 0 days.

(21) Appl. No.: 17/548,539

(22) Filed: Dec. 12, 2021

(30) Foreign Application Priority Data

Nov. 12, 2021 (TW) .................................. 110213369

(51) Int. Cl.
*H04R 1/02* (2006.01)
*A47K 3/00* (2006.01)
*H04R 3/00* (2006.01)
*H05K 5/02* (2006.01)

(52) U.S. Cl.
CPC ............. *H04R 1/025* (2013.01); *A47K 3/001* (2013.01); *H04R 3/00* (2013.01); *H05K 5/0213* (2013.01); *H05K 5/0217* (2013.01)

(58) Field of Classification Search
CPC .......... H04R 1/025; H04R 3/00; A47K 3/001; H05K 5/0213; H05K 5/0217
See application file for complete search history.

(56) References Cited

U.S. PATENT DOCUMENTS

| 2004/0156517 | A1* | 8/2004 | Schmidt | H04R 1/028 |
|---|---|---|---|---|
| | | | | 381/345 |
| 2005/0091739 | A1* | 5/2005 | Lerma | A61H 33/60 |
| | | | | 4/541.1 |
| 2008/0095395 | A1* | 4/2008 | Pieklik | A61H 33/60 |
| | | | | 381/189 |

\* cited by examiner

*Primary Examiner* — Andrew L Sniezek

(57) ABSTRACT

An elevating speaker device for use in bathtub includes: a main body having an accommodation space formed therein and having at least one water hole and a penetrating hole; and an elevating speaker member, having a lower portion thereof disposed with an inner fastening member having a base and an inner sliding member, the inner fastening member respectively has a damping teeth and a spring, the inner sliding member has a long teeth connected to the damping teeth; the elevating speaker member has an inclined plate downwardly inclined from one end towards another end, and has two ends respectively downwardly extended with a water discharging channel and a fastening channel, at least one plastic sleeve is disposed in the fastening channel and sleeved with a tubular member allowing a power wire and a signal wire to be enclosed.

3 Claims, 5 Drawing Sheets

ELEVATING SPEAKER DEVICE FOR USE IN BATHTUB

BACKGROUND OF THE INVENTION

1. Field of the Invention

The present invention relates to a device, especially to an elevating speaker device for use in bathtub which utilizes an inclined plate to guide water so as to be avoided from being in contact with a power wire and a signal wire.

2. Description of Related Art

The structure of a conventional elevating speaker device for use in bathtub is to dispose an elevating speaker member in a main body having an accommodation space, and a reeling force provided by a spring is utilized to allow the elevating speaker member to be ascended to a top surface of the main body, a center defined inside the elevating speaker member is formed with a downward channel allowing a power wire and a signal wire of a speaker to be downwardly extended, when the elevating speaker member is desired to be descended and stored in the main body, the elevating speaker member is downwardly pressed for entering the accommodation space of the main body, meanwhile the spring is stretched and stored with a force enabling the elevating speaker member to be ascended, a top surface of the stored elevating speaker member and the top surface defined at the top end of the main body are aligned for forming a planar status; for preventing the elevating speaker member from being accidentally ascended, the center defined at a bottom end of the accommodation space of the main body is disposed with a pressing buckle clip capable of being mounted with a mounting protrusion formed at the bottom end of the elevating speaker member, when the elevating speaker member is desired to be descended, the mounting protrusion is mounted in the pressing buckle clip so as to be clipped, the pressing buckle clip is downwardly pressed by the mounting protrusion again, so that the pressing buckle clip is in an opened status for allowing the mounting protrusion to be released, at this moment, the elevating speaker member is upwardly displaced via a recovering force provided by the spring; however, for the downward channel at the center of the conventional elevating speaker member, water may flow through the downward channel and enter the pressing buckle clip at the bottom end of the main body, because the interior of the pressing buckle clip is disposed with the a spring served to allow a clipping head at the top end of the pressing buckle clip to be inwardly retracted and upwardly stretched and a clipping sheet disposed at an outer side defined at the bottom end, a situation of corrosion may occur when the water enter the channel and the pressing buckle clip, thus the pressing buckle clip is unable to be operated, and the elevating speaker member is unable to be descended and fastened, moreover, situations of short circuit and poor contact may happen to the power wire and the signal wire; accordingly, the above-mentioned disadvantages existed in the prior arts shall be improved, thus the practicability is very much limited and the shortages shall be seriously concerned and improved by the skilled people in the art.

SUMMARY OF THE INVENTION

For solving the shortages existed in the prior art, one primary objective of the present invention is to provide an elevating speaker device for use in bathtub, in which an elevating speaker member is disposed in a main body and a bottom end of a speaker is disposed with an inclined plate, an outer portion of the inclined plate is downwardly extended with a water discharging channel and upwardly extended with a fastening channel, respectively; the fastening channel is disposed with a plastic sleeve and downwardly extended with a tubular member sleeved in a penetrating hole.

Another objective of the present invention is to provide an elevating speaker device for use in bathtub, in which water in an elevating speaker member is able to be collected and guided through utilizing an inclined plate for flowing from one end towards another end of a water discharging channel, so that the water can be prevented from flowing towards a power wire and a signal wire and a pressing buckle clip, thereby preventing situations of short circuit and corrosion.

One another objective of the present invention is to provide an elevating speaker device for use in bathtub, which has advantages of greatly increasing the operation safety and the durability.

Problems to be solved by the present invention are: the structure of a conventional elevating speaker device for use in bathtub is to dispose an elevating speaker member in a main body having an accommodation space, and a reeling force provided by a spring is utilized to allow the elevating speaker member to be ascended to a top surface of the main body, a center defined inside the elevating speaker member is formed with a downward channel allowing a power wire and a signal wire of a speaker to be downwardly extended, the center defined at a bottom end of the accommodation space of the main body is disposed with a pressing buckle clip capable of being mounted with a mounting protrusion formed at the bottom end of the elevating speaker member, when the elevating speaker member is desired to be descended, the mounting protrusion is mounted in the pressing buckle clip so as to be clipped, the pressing buckle clip is downwardly pressed by the mounting protrusion again, so that the pressing buckle clip is in an opened status for allowing the mounting protrusion to be released, at this moment, the elevating speaker member is upwardly displaced via a recovering force provided by the spring; however, for the downward channel at the center of the conventional elevating speaker member, water may flow through the downward channel and enter the pressing buckle clip at the bottom end of the main body thereby causing a situation of corrosion, thus the pressing buckle clip is unable to be operated, and the elevating speaker member is unable to be descended and fastened, moreover, situations of short circuit and poor contact may happen to the power wire and the signal wire; accordingly, the practicability is very much limited.

For achieving the aforesaid objectives, one technical solution provided by the present invention is to provide an elevating speaker device for use in bathtub, which includes: a main body having an accommodation space formed therein and having at least one water hole and a penetrating hole formed at a bottom end thereof; and an elevating speaker member, disposed in the accommodation space of the main body and having an upper portion thereof disposed with at least one speaker connected to at least two signal wires and an electric circuit board connected to at least two power wires, wherein a lower portion of the elevating speaker member is disposed with an inner fastening member and an inner sliding member capable of being mutually combined for sliding, an upper portion of the inner sliding member is disposed in the elevating speaker member, a lower portion of the inner fastening member is disposed with a base fastened with a bottom end of the main body, a center defined at an upper portion and two sides of the inner fastening member are respectively disposed with a damping teeth and a spring, another end of the spring is connected to two sides defined at a lower portion of the inner sliding member, a center of the inner sliding member is disposed with a long teeth connected to the damping teeth; and characterized in that: the elevating speaker member has an inclined plate disposed at a bottom end of the speaker and downwardly inclined from one end towards another end, another end defined at an outer portion of the inclined plate is downwardly extended with a water discharging channel, one end defined at the outer portion of the inclined plate is upwardly extended with a fastening channel, at least one plastic sleeve is disposed at the end of the inclined plate where the fastening channel is disposed, the plastic sleeve is sleeved with a tubular member downwardly extended and allowing the power wire and the signal wire to be enclosed, and a lower portion of the tubular member is sleeved in the penetrating hole of the main body.

Wherein, according to the present invention, the bottom end of the main body is disposed with a concave bottom plate formed in a concave status and the center thereof is corresponding to the water hole.

Wherein, according to the present invention, the concave bottom plate at the bottom end of the main body is formed, but not limited, in a rhombus shape and each surface thereof is formed with an inclined surface.

Advantages achieved by the present invention comparing to the prior art are as follows. According to the present invention, the elevating speaker member is disposed in the main body and the bottom end of the speaker is disposed with the inclined plate, the outer portion of the inclined plate is downwardly extended with the water discharging channel and upwardly extended with the fastening channel, respectively; the fastening channel is disposed with the plastic sleeve and downwardly extended with the tubular member sleeved in the penetrating hole; as such, the water of the elevating speaker member is able to be collected and guided via the inclined plate for flowing from one end towards another end of the water discharging channel, so that the water can be prevented from flowing towards the power wire and the signal wire and the pressing buckle clip, thereby preventing situations of short circuit and corrosion, and effects of greatly increasing the operation safety and the dryness and the durability can be provided; accordingly, the present invention is suitable to be greatly applied in the industrial field and provided with advantages of being novel and non-obviousness and capable of satisfying requirements of users.

BRIEF DESCRIPTION OF THE CODES

Figure 1:
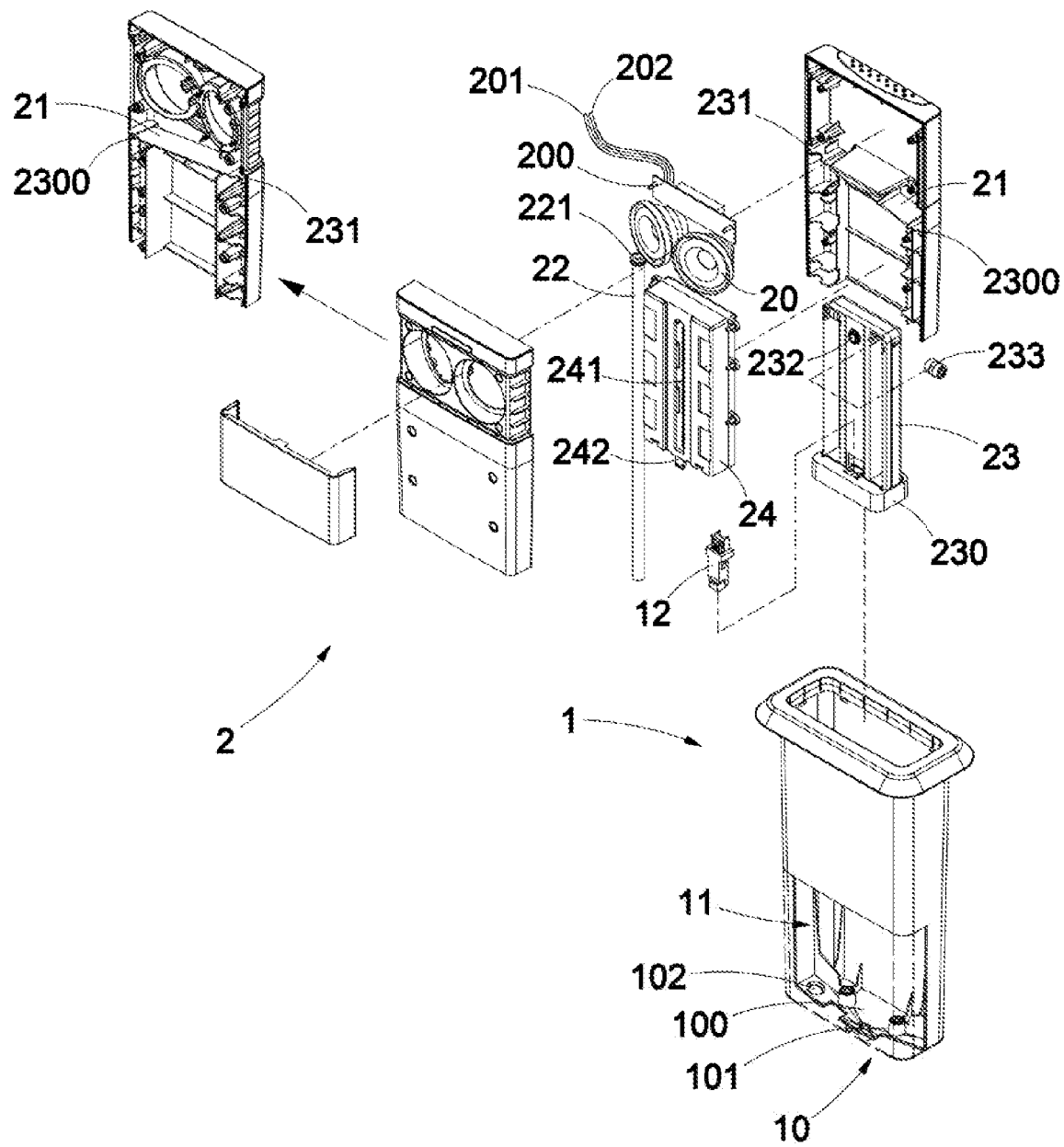
FIG. 1 is a perspective exploded view according to the present invention.

1: Main body
10: Concave bottom plate
100: Inclined surface
101: Water hole
102: Penetrating hole
11: Accommodation space
12: Pressing buckle clip
2: Elevating speaker member
20: Speaker
200: Electric circuit board
201: Power wire
202: Signal wire
21: Inclined plate
22: Tubular member
221: Plastic sleeve
23: Inner fastening member
230: Base
2300: Water discharging channel
231: Fastening channel
232: Damping teeth
233: Spring
24: Inner sliding member
241: Long teeth
242: Mounting buckle
3: Water

DETAILED DESCRIPTION OF THE PREFERRED EMBODIMENT

One preferred embodiment of the present invention will be described with reference to the drawings for illustrating the structural assembly, the technical means and the functions to be achieved by the present invention; and the actual ratios and the arrangement of components shall not be limited by the ratios and the arrangement of components in the provided figures.

Figure 2:
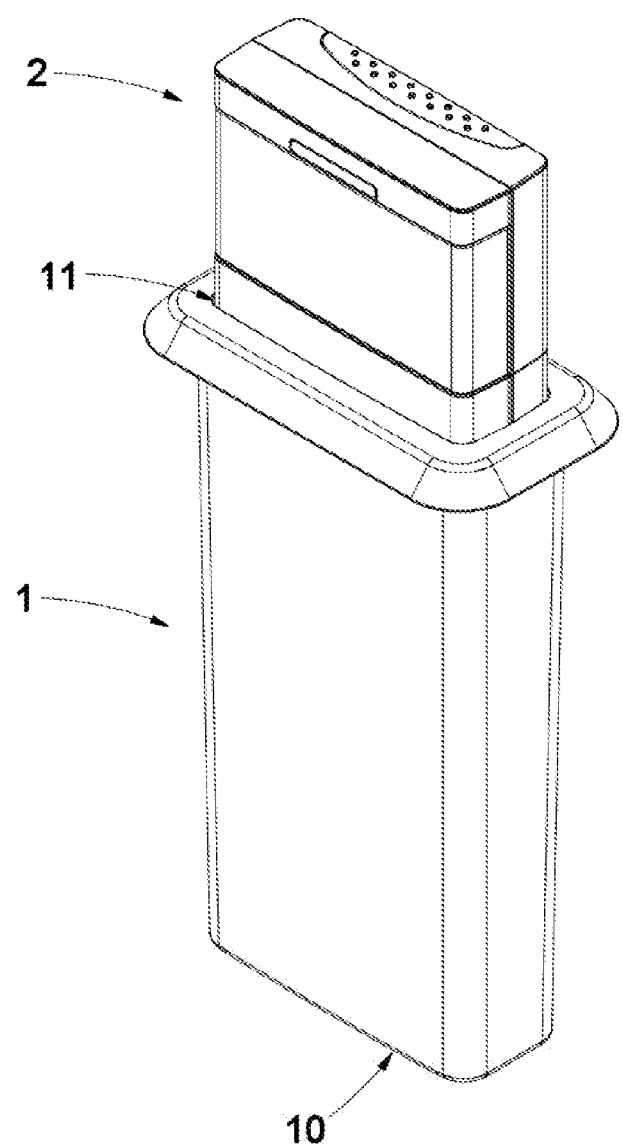
FIG. 2 is a perspective view showing the assembly according to the present invention.
Figure 3:
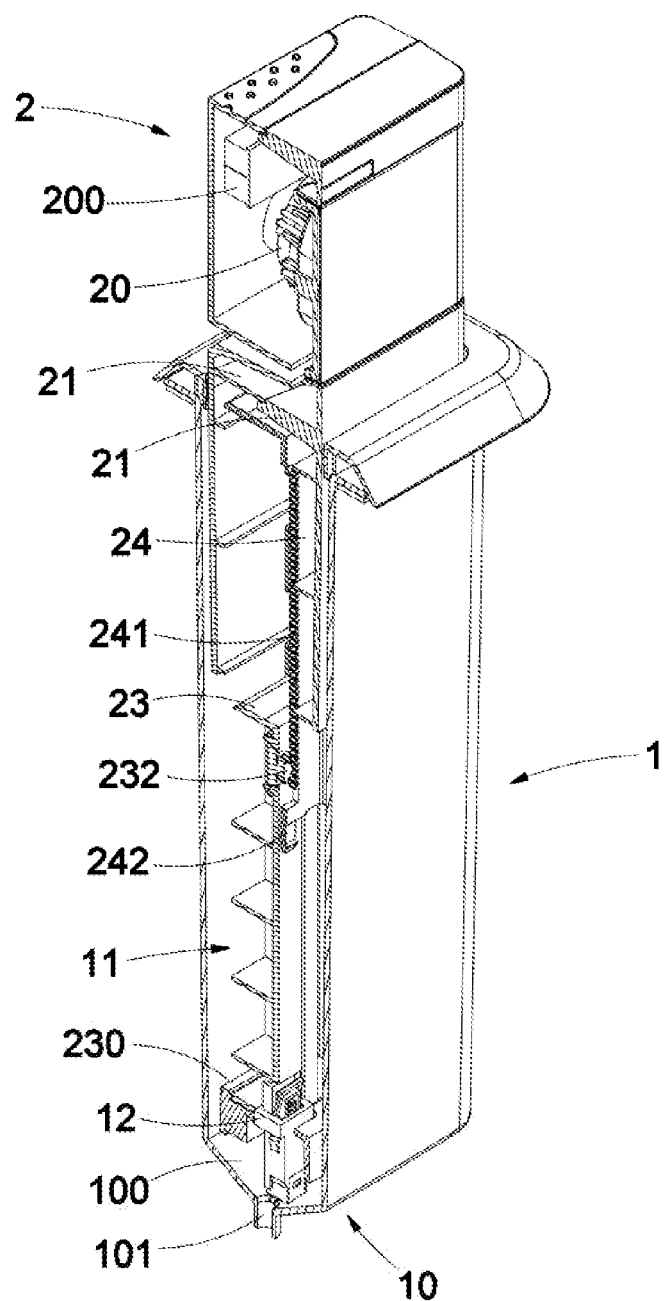
FIG. 3 is a cross sectional view showing the assembly according to the present invention.
Figure 4:
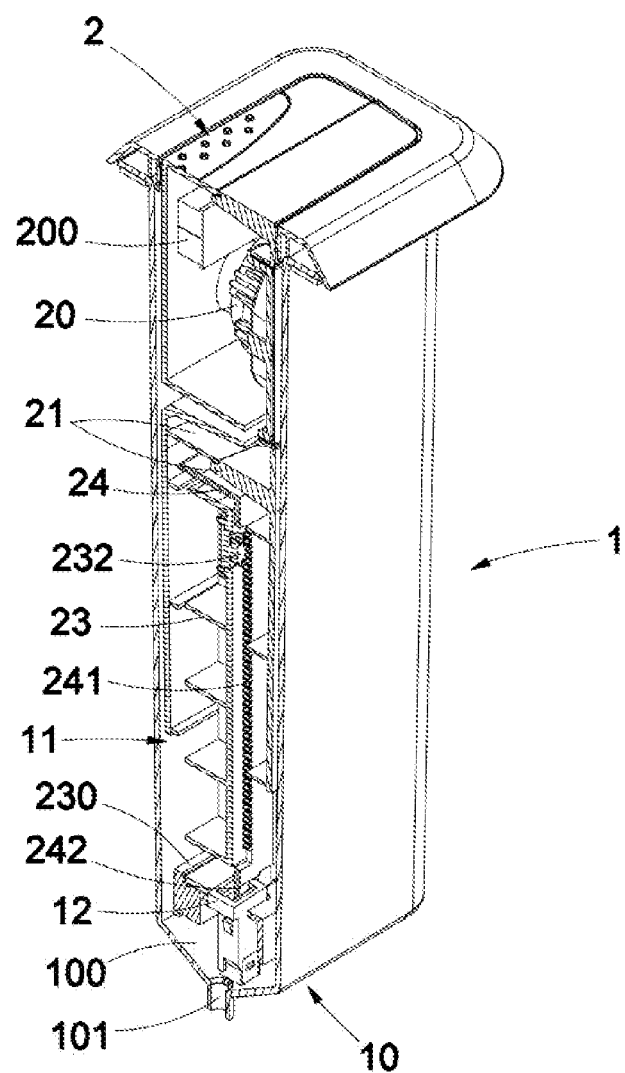
FIG. 4 is a schematic view showing the elevating speaker member being pressed into the accommodation space of the main body according to one embodiment of the present invention.
Figure 5:
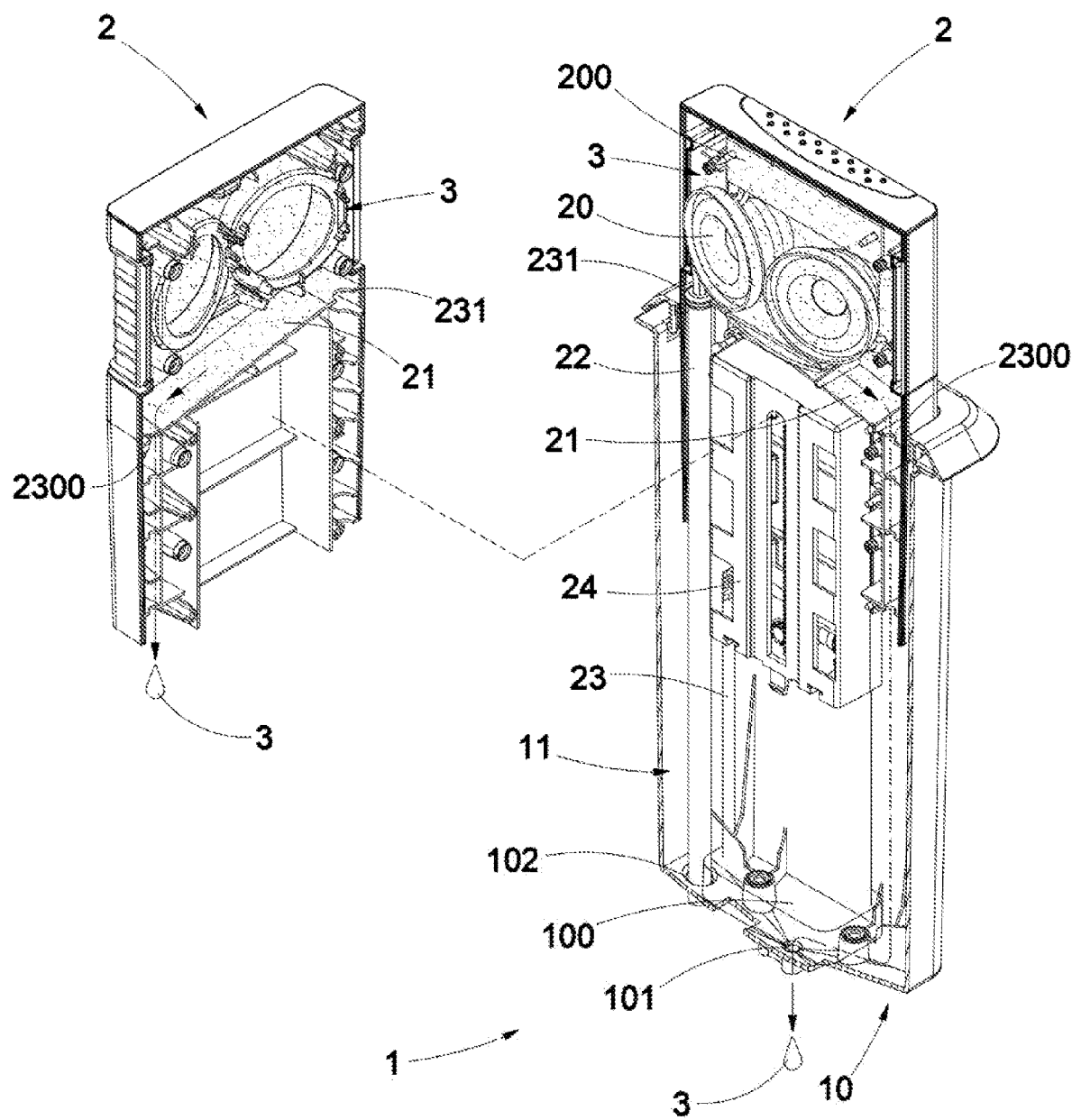
FIG. 5 is a schematic view showing the water flowing into the water discharging hole through the inclined plate of the elevating speaker member for being discharged out from the main body according to one embodiment of the present invention.

Please refer from FIG. 1 to FIG. 5, wherein FIG. 1 is a perspective exploded view according to the present invention; FIG. 2 is a perspective view showing the assembly according to the present invention; FIG. 3 is a cross sectional view showing the assembly according to the present invention; FIG. 4 is a schematic view showing the elevating speaker member being pressed into the accommodation space of the main body according to one embodiment of the present invention; and FIG. 5 is a schematic view showing the water flowing into the water discharging hole through the inclined plate of the elevating speaker member for being discharged out from the main body according to one embodiment of the present invention. According to one preferred embodiment of the present invention, an elevating speaker device for use in bathtub is provided. The elevating speaker device for use in bathtub includes a main body 1 having an accommodation space 11 formed therein and having at least one water hole 101 and a penetrating hole 101 formed at a bottom end thereof; and an elevating speaker member 2, disposed in the accommodation space 11 of the main body 1 and having an upper portion thereof disposed with at least one speaker 20 connected to at least two signal wires 202 and an electric circuit board 200 connected to at least two power wires 201, a lower portion of the elevating speaker member 2 is disposed with an inner fastening member 23 and an inner sliding member 24 capable of being mutually combined for sliding, an upper portion of the inner sliding member 24 is disposed in the elevating speaker member 2, a lower portion of the inner fastening member 23 is disposed with a base 230 fastened with a bottom end of the main body 1, a center defined at an upper portion and two sides of the inner fastening member 23 are respectively disposed with a damping teeth 232 and a spring 233, another end of the spring 233 is connected to two sides defined at a lower portion of the inner sliding member 24, a center of the inner sliding member 24 is disposed with a long teeth 241 connected to the damping teeth 232; the elevating speaker member 2 has an inclined plate 21 disposed at a bottom end of the speaker 20 and downwardly inclined from one end towards another end, another end defined at an outer portion of the inclined plate 21 is additionally and downwardly extended with a water discharging channel 2300, one end defined at the outer portion of the inclined plate 21 is upwardly extended with a fastening channel 231 and the inclined plate 21 is served to collect water 3 of the elevating speaker member 2 to flow from one end to another end so as to be guided into the water discharging channel 2300, at least one plastic sleeve 221 is disposed at the end of the inclined plate 21 where the fastening channel 231 is disposed, the plastic sleeve 221 is sleeved with a tubular member 22 downwardly extended and allowing the power wire 201 and the signal wire 202 to be enclosed, a lower portion of the tubular member 22 is sleeved in the penetrating hole 102 of the main body 1, the bottom end of the main body 1 is disposed with a concave bottom plate 10 formed in a concave status and allowing the water 3 to be collected and the center thereof is corresponding to the water hole 101 (as shown in FIG. 5); according to this embodiment, the concave bottom plate 10 at the bottom end of the main body 1 is formed in a rhombus shape and each surface thereof is formed with an inclined surface 100 used for guiding the water 3, but what shall be addressed is that the scope of the present invention is not limited to the above-mentioned arrangement.

Please refer from FIG. 1 to FIG. 4 and according to the present invention, the elevating speaker member 2 is ascended from the accommodation space 11 of the main body 1 via the spring 233, and an effect generated through the damping teeth 232 of the inner fastening member 23 and the long teeth 241 of the inner sliding member 24 allows the elevating speaker member 2 to be damped so as to be slowly ascended (as shown in FIG. 1, FIG. 2 and FIG. 3), at this moment, a pressing buckle clip 12 is formed in an opened status and separated from a mounting buckle 242 of the inner sliding member 24 (as shown in FIG. 1, FIG. 2 and FIG. 3); when the elevating speaker member 2 is desired to be downwardly descended for entering the main body 1, only the elevating speaker member 2 is required to be downwardly pressed for entering the accommodation space 11 of the main body 1, and the spring 233 is stretched during the downwardly pressing process and served as a dynamic force for allowing the elevating speaker member 2 to be ascended in the next time, when the mounting buckle 242 disposed at the bottom end of the inner sliding member 24 contacts and enters the pressing buckle clip 12, the pressing buckle clip 12 is formed in a closed status for clipping and fastening the mounting buckle 242, at this moment, the inner sliding member 24 is not affected by the reverse elastic force of the spring 233 thereby not being ascended, and a top surface of the main body 1 is aligned with a top surface of the elevating speaker member 2 for forming a planar status (as shown in FIG. 4), when the elevating speaker member 2 is desired to be ascend again, only the pressing buckle clip 12 is required to be downwardly pressed again, the pressing buckle clip 12 is formed in the opened status for allowing the mounting buckle 242 of the inner sliding member 24 to be released, meanwhile the elevating speaker member 2 is able to be ascended through the stretching power stored in the spring 233 (as shown in FIG. 1, FIG. 2 and FIG. 3); when the water 3 enters the elevating speaker member 2, the water 3 is guided into the water discharging channel 2300 through the inclined plate 21 so as to flow out from the water hole 101 of the main body 1, when the water 3 enters the main body 1, the water 3 flows out from the water hole 101 disposed the bottom end, so that when being applied in a bathtub, the main body 1 and the elevating speaker member 2 can be kept in a dry status. According to the present invention, the elevating speaker member 2 is disposed in the main body 1 and the bottom end of the speaker 20 is disposed with the inclined plate 21, the outer portion of the inclined plate 21 is downwardly extended with the water discharging channel 2300 and upwardly extended with the fastening channel 231, respectively; the fastening channel 231 is disposed with the plastic sleeve 221 and downwardly extended with the tubular member 22 sleeved in the penetrating hole 102; as such, the water 3 of the elevating speaker member 2 is able to be collected and guided via the inclined plate 21 for flowing from one end towards another end of the water discharging channel 2300, so that the water 3 can be prevented from flowing towards the power wire 201 and the signal wire 202 and the pressing buckle clip 12, thereby preventing situations of short circuit and corrosion, and effects of greatly increasing the operation safety and the durability can be provided; accordingly, the present invention is suitable to be greatly applied in the industrial field and provided with advantages of being novel and non-obviousness and capable of satisfying requirements of users.

Based on what has been disclosed above, the present invention is novel comparing to prior arts, and achieves effects which are desired to be achieved, and the feature of the present invention is easy to be invented by the skilled people in the arts, moreover, the feature of the present invention has not been published and complies with the patentability of novelty, practicability and non-obviousness. As such, the present invention is applied with a hope of being granted so as to contribute to the relative technical fields. Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An elevating speaker device for use in bathtub, including: a main body having an accommodation space formed therein and having at least one water hole and a penetrating hole formed at a bottom end thereof; and an elevating speaker member, disposed in the accommodation space of the main body and having an upper portion thereof disposed with at least one speaker connected to at least two signal wires and an electric circuit board connected to at least two power wires, wherein a lower portion of the elevating speaker member is disposed with an inner fastening member and an inner sliding member capable of being mutually combined for sliding, an upper portion of the inner sliding member is disposed in the elevating speaker member, a lower portion of the inner fastening member is disposed with a base fastened with a bottom end of the main body, a center defined at an upper portion and two sides of the inner fastening member are respectively disposed with a damping teeth and a spring, another end of the spring is connected to two sides defined at a lower portion of the inner sliding member, a center of the inner sliding member is disposed with a long teeth connected to the damping teeth; and characterized in that: the elevating speaker member has an inclined plate disposed at a bottom end of the speaker and downwardly inclined from one end towards another end, another end defined at an outer portion of the inclined plate is upwardly extended with a water discharging channel, one end defined at the outer portion of the inclined plate is downwardly extended with a fastening channel, at least one plastic sleeve is disposed at the end of the inclined plate where the fastening channel is disposed, the plastic sleeve is sleeved with a tubular member downwardly extended and allowing the power wire and the signal wire to be enclosed, and a lower portion of the tubular member is sleeved in the penetrating hole of the main body.

2. The elevating speaker device for use in bathtub as claimed in claim 1, wherein the bottom end of the main body is disposed with a concave bottom plate formed in a concave status and the center thereof is corresponding to the water hole.

3. The elevating speaker device for use in bathtub as claimed in claim 1, wherein the concave bottom plate at the bottom end of the main body is formed, but not limited, in a rhombus shape and each surface thereof is formed with an inclined surface.

\* \* \* \* \*